(12) United States Patent
Hall et al.

(10) Patent No.: US 10,461,028 B2
(45) Date of Patent: Oct. 29, 2019

(54) SEMICONDUCTOR DEVICE INCLUDING A VERTICAL ONE-TIME PROGRAMMABLE FUSE THAT INCLUDES A CONDUCTIVE LAYER AND A RESISTIVE MATERIAL AND A METHOD OF MAKING THE SAME

(71) Applicant: SEMICONDUCTOR COMPONENTS INDUSTRIES, LLC, Phoenix, AZ (US)

(72) Inventors: Jefferson W. Hall, Chandler, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/644,418

(22) Filed: Jul. 7, 2017

(65) Prior Publication Data
US 2018/0025982 A1    Jan. 25, 2018

Related U.S. Application Data

(60) Provisional application No. 62/365,677, filed on Jul. 22, 2016.

(51) Int. Cl.
*H01L 23/525* (2006.01)
*G11C 17/16* (2006.01)
(Continued)

(52) U.S. Cl.
CPC .......... *H01L 23/5256* (2013.01); *G11C 17/16* (2013.01); *G11C 17/18* (2013.01);
(Continued)

(58) Field of Classification Search
CPC ................. H01L 23/5258; H01L 23/5256
See application file for complete search history.

(56) References Cited

U.S. PATENT DOCUMENTS

| 4,635,345 A | * | 1/1987 | Hankins | ................ H01L 21/033 257/209 |
| 5,904,507 A | * | 5/1999 | Thomas | .............. H01L 23/5254 257/E23.148 |

(Continued)

OTHER PUBLICATIONS

He et al.; "Zero-Mask Contact Fuse for One-Time-Programmable Memory in Standard CMOS Processes"; IEEE Electron Device Letters, vol. 32, No. 7; 2011; pp. 955-957.

*Primary Examiner* — Quoc D Hoang
(74) *Attorney, Agent, or Firm* — Abel Schillinger, LLP

(57) ABSTRACT

A vertical OTP fuse formed in a semiconductor device has a substrate and an insulating layer formed over the substrate with an opening through the insulating layer extending to the substrate. A conductive layer, such as silicide, is formed over a sidewall of the opening. A resistive material, such as polysilicon, is deposited within the opening over the first conductive layer to form a first vertical OTP fuse. A plurality of vertical OTP fuses can be arranged in an array. A PN junction diode or transistor is formed in the substrate aligned with the first vertical OTP fuse. A second conductive layer is formed over the first vertical OTP fuse. The first vertical OTP fuse can be disposed between the second conductive layer and a third conductive layer. A second vertical OTP fuse can be formed over the first vertical OTP fuse for redundancy.

20 Claims, 12 Drawing Sheets

(51) Int. Cl.
*G11C 17/18* (2006.01)
*H01L 21/768* (2006.01)
H01L 23/532 (2006.01)
H01L 27/112 (2006.01)

(52) U.S. Cl.
CPC ...... *H01L 21/768* (2013.01); *H01L 23/53223* (2013.01); *H01L 27/11206* (2013.01)

(56) References Cited

U.S. PATENT DOCUMENTS

| | | | |
|---|---|---|---|
| 7,642,176 B2 | 1/2010 | Cheng et al. | |
| 8,174,091 B2 * | 5/2012 | Thei | H01L 23/5256 257/529 |
| 9,305,973 B2 | 4/2016 | Chung | |
| 9,755,032 B1 | 9/2017 | Grivna | |
| 2017/0365678 A1 | 12/2017 | Grivna | |

* cited by examiner

SEMICONDUCTOR DEVICE INCLUDING A VERTICAL ONE-TIME PROGRAMMABLE FUSE THAT INCLUDES A CONDUCTIVE LAYER AND A RESISTIVE MATERIAL AND A METHOD OF MAKING THE SAME

CLAIM TO DOMESTIC PRIORITY

The present application claims the benefit of U.S. Provisional Application No. 62/365,677, filed Jul. 22, 2016, by Jefferson W. HALL and Gordon M. GRIVNA, which application is incorporated herein by reference.

FIELD OF THE INVENTION

The present invention relates in general to semiconductor devices and, more particularly, to a semiconductor device and method of forming a vertical one-time-programmable fuse.

BACKGROUND

A semiconductor wafer or substrate can be made with a variety of base substrate materials, such as silicon (Si), germanium, aluminum phosphide, aluminum arsenide, gallium arsenide (GaAs), gallium nitride (GaN), aluminum gallium nitride over gallium nitride (AlGaN/GaN), indium phosphide, silicon carbide (SiC), or other bulk material for structural support. A plurality of semiconductor die is formed on the wafer separated by a non-active, inter-die substrate area or saw street. The saw street provides cutting areas to singulate the semiconductor wafer into individual semiconductor die.

The semiconductor die may contain read-only-memory (ROM) implemented using a one-time programmable (OTP) fuse to permanently store data. ROM holds information such as firmware, encryption keys, identification code, parametric trim information, or other configuration or local fixed data for the semiconductor die. An OTP fuse as formed on a semiconductor die can be programmed by driving relatively high electrical currents through the fuse. A programmed fuse reads as a relatively high electrical resistance, while a fuse that has not been programmed reads as a relatively low electrical resistance. Programmed and unprogrammed fuses are read by driving a lower electrical current through the fuse to measure a voltage level indicative of the fuse resistance, and comparing the voltage level against a threshold value. The lower electrical current is used to read the fuses without affecting their resistance. Unprogrammed fuses are interpreted as a first logic state, e.g., logic zero, while programmed fuses are interpreted as a second logic state, e.g., logic one.

In the prior art, an OTP fuse is commonly formed by a polysilicon layer disposed laterally (horizontally) across a surface of the semiconductor die, in a plane parallel to the active surface. A relatively thin silicide layer is formed on the lateral polysilicon layer. The polysilicon layer is doped such that it has a high electrical resistance relative to the overlying silicide layer. The large electric current used for programming an OTP fuse is initially carried mostly by the silicide layer, which causes the silicide layer to heat to a temperature that melts and diffuses a portion of the silicide material into the polysilicon. The current is then carried predominately by the fuse body as the silicide and dopant atoms drift or migrate to one end of the fuse. Once the silicide has sufficiently diffused and drifted to one end, polycrystalline or amorphous silicon remains in the body of the fuse. The electrical resistance of the programmed fuse is therefore approximately equivalent to the electrical resistance through the amorphous silicon body, which is significantly higher than an unprogrammed fuse that includes a complete low resistance path of silicide through the fuse.

The lateral OTP fuse takes up significant space on the semiconductor die due to its planar orientation with respect to the die surface. The driver circuit for directing the programming current through the OTP fuse also takes up considerable space. Many prior art OTP implementations use driver transistors formed in spaces laterally offset from the fuses themselves. In area-sensitive applications, which include most semiconductor die, it is desirable to minimize the space allocation for the OTP fuse and associated programming circuits. The die area allocation for OTP fuses becomes particularly problematic for applications with large OTP memory requirements. A large die may be needed for a number of lateral OTP fuses, which adds cost.

BRIEF DESCRIPTION OF THE DRAWING

FIG. 7 illustrates a circuit for programming and reading the array of vertical OTP fuses in FIG. 6a;

FIG. 8 illustrates a portion of a layout for the array of vertical OTP fuses in FIG. 6a;

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
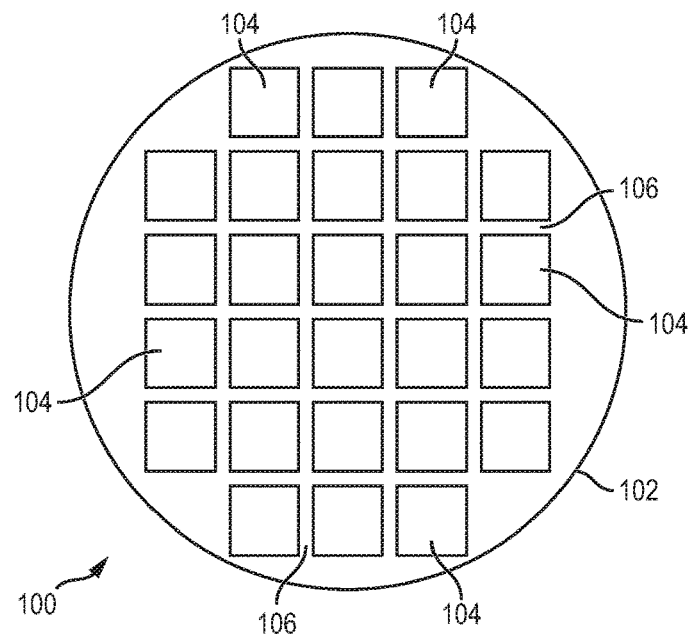
FIGS. 1a-1b illustrate a semiconductor substrate with a plurality of semiconductor die separated by a saw street.

FIG. 1a shows a semiconductor wafer or substrate 100 with a base substrate material 102, such as Si, germanium, aluminum phosphide, aluminum arsenide, GaAs, GaN, AlGaN/GaN, indium phosphide, SiC, or other bulk material for structural support. Semiconductor substrate 100 has a width or diameter of 100-450 millimeters (mm) and thickness of about 700-800 micrometers (μm). A plurality of semiconductor die 104 is formed on substrate 100 separated by a non-active, inter-die substrate area or saw street 106. Saw street 106 provides cutting areas to singulate semiconductor substrate 100 into individual semiconductor die 104.

Figure 1B:
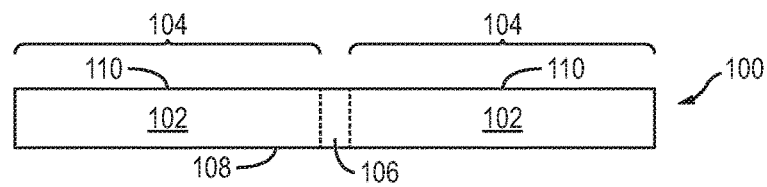

FIG. 1b shows a cross-sectional view of a portion of semiconductor substrate 100. Each semiconductor die 104 includes a back surface 108 and active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits. Semiconductor die 104 may also contain a digital signal processor (DSP), microcontroller, ASIC, standard logic, amplifiers, clock management, memory, interface circuit, optoelectronics, and other signal processing circuits. Semiconductor die 104 may also contain integrated passive devices (IPDs), such as inductors, capacitors, and resistors, for RF signal processing. In particular, one or more vertical OTP fuses are formed on semiconductor die 104 to control configuration of other circuits on the die.

Semiconductor wafer 100 can be singulated through saw street 106 using a saw blade, plasma etch, or laser cutting tool into individual semiconductor die 104.

Figure 2A:
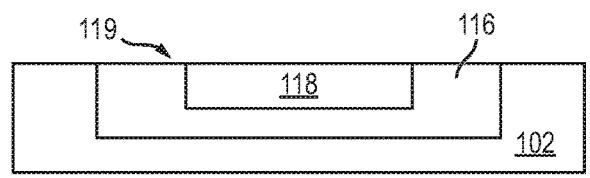
FIGS. 2a-2f illustrate a process of forming a vertical OTP fuse over a PN junction.

FIG. 2a illustrates a cross-sectional view of a portion of semiconductor wafer 100 or semiconductor die 104. Semiconductor die 104 includes well region 116 and doped region 118 formed with well region 116 of base substrate material 102. In another embodiment, region 116 is an epitaxial layer grown over a semiconductor wafer. Region 118 is doped with an opposite type of dopant from region 116. In one embodiment, region 118 is a P-type semiconductor material doped with acceptor atoms, e.g., heavy and shallow implantation, and region 116 is an N-type semiconductor material doped with donor atoms, e.g., lighter and deeper implantation. Donor dopant atoms provide an extra electron to the silicon lattice, turning a region of a silicon substrate into a negative or N-type region. Acceptor dopant atoms create an electron hole in the silicon lattice, turning a region of a silicon substrate into a positive or P-type region. Regions 118 and 116 form a PN junction diode 119 with region 116 as the cathode and region 118 as the anode. Alternatively, region 118 is an N-type semiconductor material, and region 116 is a P-type semiconductor material, where region 116 is the anode and region 118 is the cathode of the PN junction diode. Base substrate material 102 can be the same type dopant as region 118 to form a bipolar transistor, in which case region 118 is the emitter, region 116 is the base, and base substrate 102 is the collector.

Figure 2B:
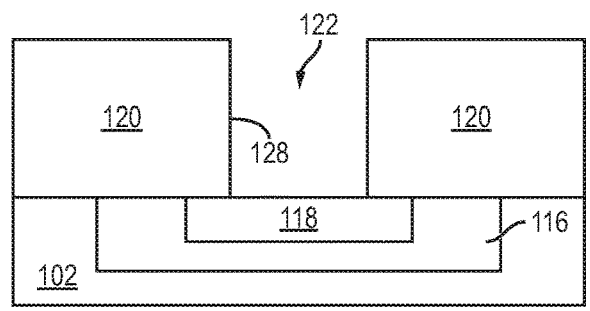
Figure 2C:
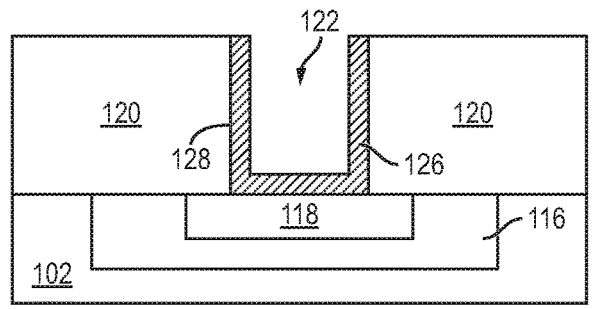
Figure 2D:
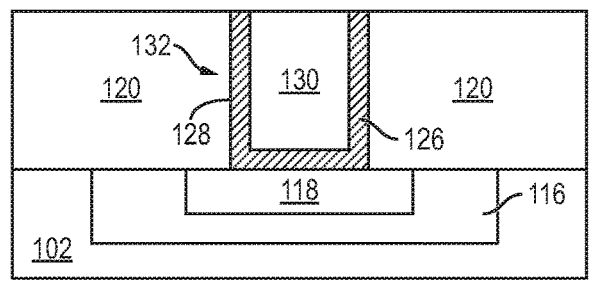

In FIG. 2b, an insulating or dielectric layer 120 is formed over base substrate material 102. An opening 122 is formed through insulating layer 120 aligned with and extending to P-type region 118, as part of forming a vertical OTP fuse. Opening 122 can be formed by direct laser ablation (LDA), plasma etching, or other etching process. In FIG. 2c, a conductive layer 126, such as a silicide material, is conformally applied into opening 122 and in contact with sidewalls 128 of insulating layer 120 and a surface of P-type region 118. Conductive layer 126 can be titanium, cobalt, tungsten, WSi2, TiSi2, or other similar material. In FIG. 2d, resistive material 130 is deposited in the remaining portion of opening 122 over conductive layer 126. In one embodiment, resistive material 130 is polysilicon or other material having a resistivity in the range of 1E1-1E3 over an impurity concentration of 1E12-1E15. Alternatively, resistive material 130 has a resistivity 10× or greater than, or electrical conductivity 0.1 or less, that of conductive layer 126. In another embodiment, resistive material 130 is a dielectric material. Conductive layer 126 and resistive material 130 in opening 122 form vertical OTP fuse 132 aligned with P-type region 118 and diode 119.

Figure 2E:
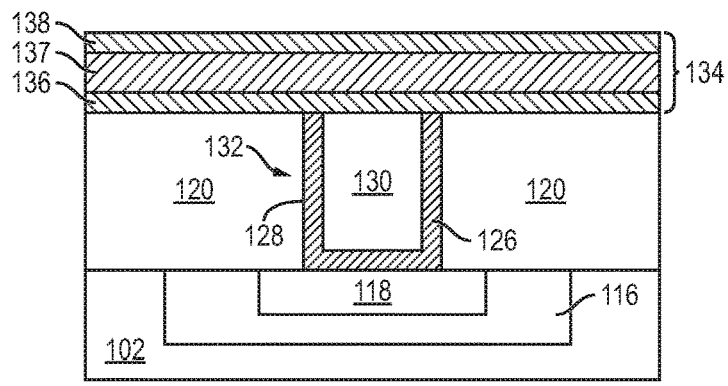

In FIG. 2e, electrically conductive layer 134 is formed over vertical fuse 132 and insulating layer 120 using PVD, CVD, electrolytic plating, electroless plating process, or other suitable metal deposition process. Conductive layer 134 includes one or more layers of aluminum (Al), copper (Cu), tin (Sn), nickel (Ni), gold (Au), silver (Ag), titanium (Ti), titanium nitride (TiN), titanium tungsten (TiW), TiNiCu, TiNiAg, or other suitable electrically conductive material. Conductive layer 134 can be patterned to provide electrical connection to conductive layer 126 to program vertical OTP fuse 132, or read the resistance value of the fuse. In one embodiment, conductive layer 134 includes Ti/TiN layer 136, Al layer 137, and TiN layer 138. Prior to programming, conductive layer 126 forms a complete electrical path from conductive layer 134 through insulating layer 120 to base substrate material 102. The resistance of vertical OTP fuse 132 is determined by conductive layer 126, which is a low value prior to programming.

In particular, OTP fuse 132 is oriented vertically within opening 122 of insulating layer 120. By nature of its vertical construction, OTP fuse 132, as formed over and aligned with the PN junction of regions 116-118, occupies less silicon area and provides a high density (fuses per unit area) layout.

Figure 2F:
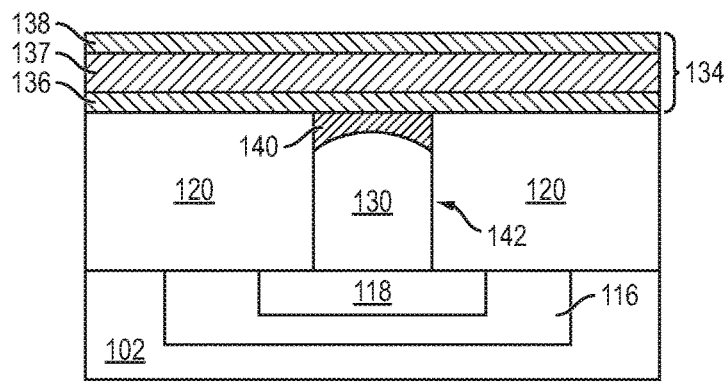

A programming-magnitude electrical current can be routed vertically through conductive layer 126 to program OTP fuse 132. The programming current flows through the forward biased PN junction. The heat generated by the programming current causes a portion of conductive layer 126 to diffuse into resistive material 130. Conductive layer 126 migrates in the direction of electron flow and collects in region 140 around electrically conductive layer 134, as shown in FIG. 2f. After programming, conductive layer 126 no longer forms a complete electrical path from conductive layer 134 through insulating layer 120 to base substrate material 102. The resistance of vertical OTP fuse 132 is determined by resistive material 130, which is a high value after programming. FIG. 2f illustrates an example of conductive layer migration using a silicide, where the silicide atoms flow symmetrically from base substrate material 102 toward conductive layer 134. In practice, the silicide migration pattern varies depending on circuit design and layout choices. For example, a residual portion of conductive layer 126 may remain at the top of opening 122 on conductive layer 134, or at the bottom of opening 122 on base substrate material 102.

In general, FIG. 2e illustrates vertical OTP fuse 132 that has not been programmed, and FIG. 2f illustrates a programmed vertical OTP fuse 142. The electrical resistance through the unprogrammed vertical OTP fuse 132 is determined by conductive layer 126 that extends completely between conductive layer 134 and base substrate material 102. The electrical resistance through the programmed vertical OTP fuse 142 is determined by resistive material 130. Accordingly, the electrical resistance through the programmed vertical OTP fuse 142 is significantly greater than the electrical resistance through the unprogrammed vertical OTP fuse 132. The resistance can be read as the programmed state of the OTP fuse. In one embodiment, a programmed vertical OTP fuse (high resistance) is read as logic one, and an unprogrammed vertical OTP fuse (low resistance) is read as logic zero.

Figure 3:
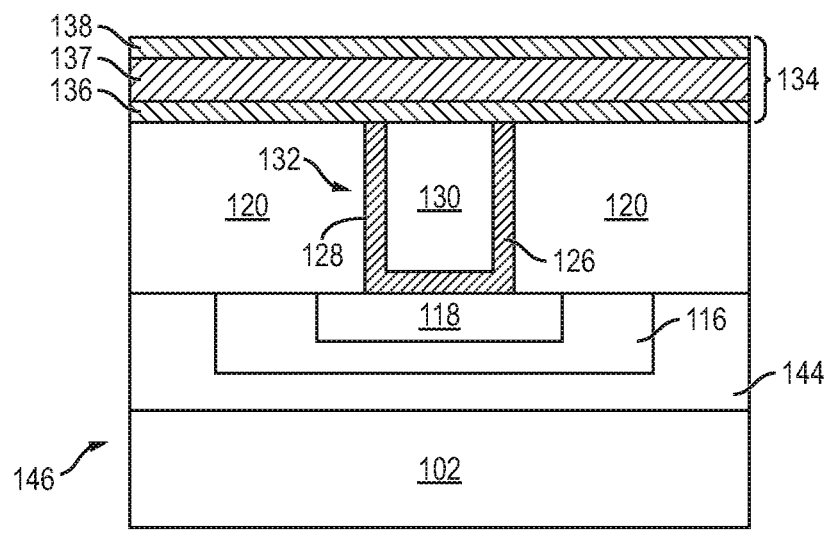
FIG. 3 illustrates the vertical OTP fuse formed over bipolar transistor.

FIG. 3 illustrates an alternative embodiment where EPI layer 144 is grown over base substrate material 102. Well region 116 is formed in EPI layer 144 and region 118 is formed in well region 116. P-type region 118, N-type region 116, and P-type EPI layer 144 form a PNP bipolar-junction transistor (BJT) 146 to control electrical current through vertical OTP fuse 132. P-type region 118 operates as the emitter of BJT 146, region 116 is the base, and EPI layer 144 is the collector.

Figure 4A:
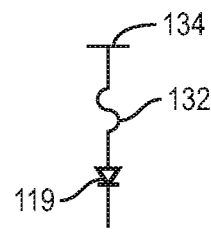
FIGS. 4a-4b illustrate a schematic representation of FIGS. 2e and 3, respectively.
Figure 4B:
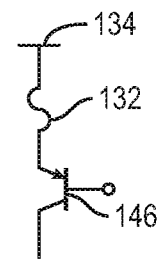

FIG. 4a is a schematic representation of vertical OTP fuse 132 with PN junction diode 119 from FIG. 2e. FIG. 4b is a schematic representation of vertical OTP fuse 132 with BJT 146 from FIG. 3.

Figure 5:
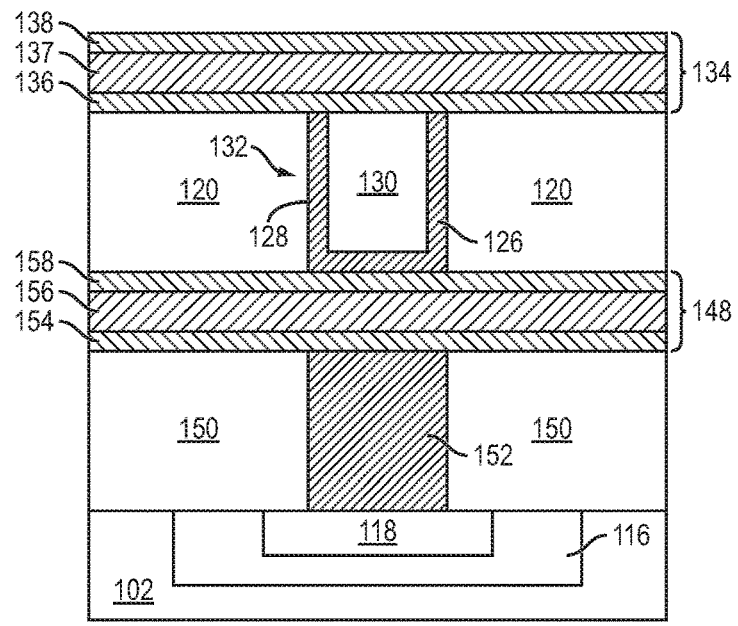
FIG. 5 illustrates the vertical OTP fuse formed between two conductive layers.

FIG. 5 illustrates an alternative embodiment where vertical OTP fuse 132 is formed between conductive layer 134 and conductive layer 148. Continuing from FIG. 2a, an insulating layer 150 is formed over base substrate material 102. An opening is formed through insulating layer 150 extending to region 118, similar to FIG. 2b. An electrically conductive material 152 is formed within the opening over region 118 as a conductive plug or via. Conductive layer 148 is formed over insulating layer 150 and conductive material 152 using PVD, CVD, electrolytic plating, electroless plating process, or other suitable metal deposition process. Conductive layer 148 includes one or more layers of Al, Cu, Sn, Ni, Au, Ag, Ti, TiN, TiW, TiNiCu, TiNiAg, or other suitable electrically conductive material. In one embodiment, conductive layer 148 includes Ti/TiN layer 154, Al layer 156, and TiN layer 158. Vertical OTP fuse 132, as described in FIGS. 2b-2d, is formed through insulating layer 120 over conductive layer 148. Conductive layer 134 is formed over insulating layer 120 and vertical OTP fuse 132. Conductive layers 134 and 148 can be patterned to provide electrical connection to conductive layer 126 to program vertical OTP fuse 132, or read the resistance value of the fuse.

Figure 6A:
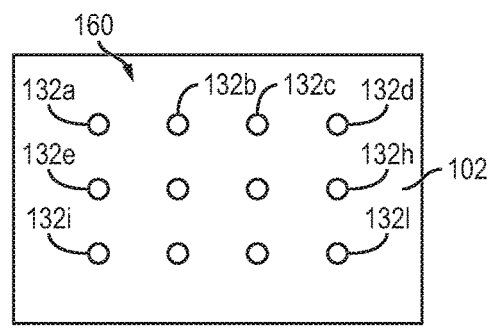
FIGS. 6a-6b illustrate an array of vertical OTP fuses and a vector of vertical OTP fuses, respectively.
Figure 6B:
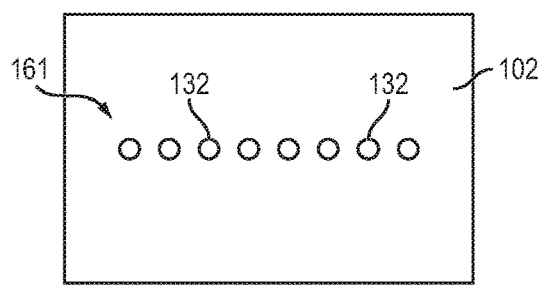

FIG. 6a illustrates a plurality of vertical OTP fuses 132 arranged in a two-dimensional array 160 across base substrate material 102. The vertical orientation of OTP fuses 132a-132l occupies less area and provides a significantly higher density than lateral OTP fuses. In some embodiments, the density of vertical OTP fuses 132a-132l, as determined by the capability of the photolithographic process, can be 40× the density of lateral OTP fuses. Vertical OTP fuses 132 can also be arranged in a 1×N vector memory arrangement 161, as shown in FIG. 6b.

Figure 7:
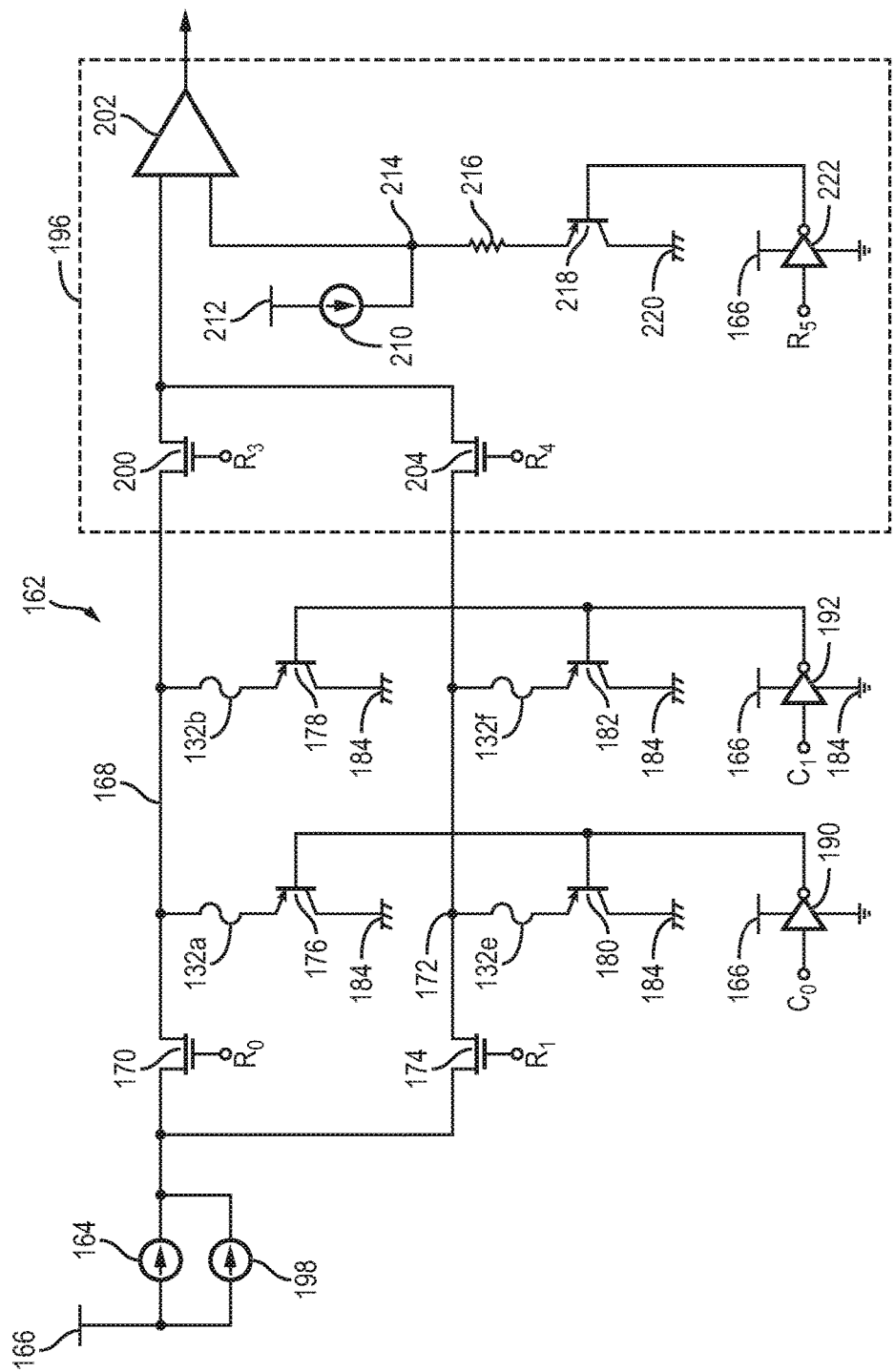

FIG. 7 illustrates programming circuit 162 for vertical OTP fuses 132a-132l in FIG. 6a. Vertical OTP fuses 132a-132l are accessed one at a time and individually programmed, or all fuses to be programmed in a single row can be accessed and programmed at once. Current source 164 receives operating potential from voltage source 166 and drives row line 168 through row select programming transistor 170, and row line 172 through row select programming transistor 174. Control signal $R_0$ is coupled to the gate of transistor 170, and control signal $R_1$ is coupled to the gate of transistor 174. Vertical OTP fuse 132a is coupled between row line 168 and the emitter of transistor 176, and vertical OTP fuse 132b is coupled between row line 168 and the emitter of transistor 178. Similarly, vertical OTP fuse 132e is coupled between row line 172 and the emitter of transistor 180, and vertical OTP fuse 132f is coupled between row line 172 and the emitter of transistor 182. The collector of transistors 176-182 are coupled to power supply terminal 184 operating at ground potential. Control signal $C_0$ is coupled to an input of inverter 190. The output of inverter 190 is coupled to the base of transistors 176 and 180. Control signal $C_1$ is coupled to an input of inverter 192. The output of inverter 192 is coupled to the base of transistors 178 and 182. Inverters 190 and 192 are supplied by voltage source 166 and power supply terminal 184 to achieve the proper base voltage for transistors 176-182 to ensure intended programming of vertical OTP fuses 132a-132l and avoid unintentional programming of the vertical OTP fuses due to parasitic effects. Column select programming transistors 176-182 are implemented by region 116, region 118, and substrate 144, as described in FIG. 3. The vertical orientation of OTP fuse 132a-132b and 132e-132f, as formed over column select programming transistors 176-182, reduces silicon area.

To program vertical OTP fuse 132a, a high value of control signal $R_0$ is applied to the gate of transistor 170, and a low value of control signal $R_1$ is applied to the gate of transistor 174. A high value of control signal $C_0$ is applied to the input of inverter 190 (often final step to avoid parasitic issues), and a low value of control signal $C_1$ is applied to the input of inverter 192. Transistor 170 conducts and transistors 174 and 180 are non-conductive. The low voltage from inverter 190 forward biases and turns on transistor 176. The high voltage from inverter 192 turns off transistors 178 and 182. The high programming current from current source 164, e.g., up to 50 milliamps (mA) depending on the technology feature size, physical dimensions, and material properties, flows through transistor 170, vertical OTP fuse 132a, and transistor 176. The high programming current is sufficient to program the fuse, as described in FIG. 2f. Vertical OTP fuse 132a is permanently set to a programmed logic state, e.g., logic one. No other vertical OTP fuse 132b-132l is affected.

To program vertical OTP fuse 132b, a high value of control signal $R_0$ is applied to the gate of transistor 170, and a low value of control signal $R_1$ is applied to the gate of transistor 174. A low value of control signal $C_0$ is applied to the input of inverter 190, and a high value of control signal $C_1$ is applied to the input of inverter 192. Transistor 170 conducts and transistors 174 and 182 are non-conductive. The low voltage from inverter 192 forward biases and turns on transistor 178. The high voltage from inverter 190 turns off transistors 176 and 180. The high programming current from current source 164 flows through transistor 170, vertical OTP fuse 132b, and transistor 178 to program the fuse, as described in FIG. 2f. Vertical OTP fuse 132b is permanently set to a programmed logic state, e.g., logic one. No other vertical OTP fuse 132a and 132c-132l is affected.

To program vertical OTP fuse 132e, a low value of control signal $R_0$ is applied to the gate of transistor 170, and a high value of control signal $R_1$ is applied to the gate of transistor 174. A high value of control signal $C_0$ is applied to the input of inverter 190, and a low value of control signal $C_1$ is applied to the input of inverter 192. Transistor 174 conducts and transistors 170 and 176 are non-conductive. The low voltage from inverter 190 forward biases and turns on transistor 180. The high voltage from inverter 192 turns off transistors 178 and 182. The high programming current from current source 164 flows through transistor 174, vertical OTP fuse 132e, and transistor 180 to program the fuse, as described in FIG. 2f. Vertical OTP fuse 132e is permanently set to a programmed logic state, e.g., logic one. No other vertical OTP fuse 132a-132d and 132f-132l is affected.

To program vertical OTP fuse 132f, a low value of control signal $R_0$ is applied to the gate of transistor 170, and a high value of control signal $R_1$ is applied to the gate of transistor 174. A low value of control signal $C_0$ is applied to the input of inverter 190, and a high value of control signal $C_1$ is applied to the input of inverter 192. Transistor 174 conducts and transistors 170 and 178 are non-conductive. The low voltage from inverter 192 forward biases and turns on transistor 182. The high voltage from inverter 190 turns off transistors 176 and 180. The high programming current from current source 164 flows through transistor 174, vertical OTP fuse 132f, and transistor 182 to program the fuse, as described in FIG. 2f. Vertical OTP fuse 132f is permanently set to a programmed logic state, e.g., logic one. No other vertical OTP fuse 132a-132e and 132g-132l is affected.

The combination of transistors 170 and 174, and transistors 176-182, control selection of one individual vertical OTP fuse 132 for programming. Each vertical OTP fuses 132a-132l is individually programmed by circuit 162 to read as logic one, or can be left unprogrammed to read as logic zero. Array 160 with multiple vertical OTP fuses 132 provides multiple bits of data for firmware, encryption keys, identification code, parametric trim information, or other configuration or local fixed data applications for circuits on semiconductor die 104. Vertical OTP fuse 132 stacked on PN junction regions 116-118 (diode 119) or regions 116, 118, 144 (BJT 146) further reduces the footprint of the device and increases fuse density. Any size array with any number of rows and columns can be programmed by expanding the rows and columns control logic of programming circuit 162. PN junctions implemented by regions 116 and region 118 in FIG. 2e can be used to program vertical OTP fuses 132 in a vector arrangement of FIG. 6b.

Parasitic effects should be controlled to reduce the likelihood that parasitic electric current paths will program fuses other than the one intended to be programmed. Because parasitic paths and elements, such as the quoted capacitances, exist, they need to be driven to known states that will not negatively affect operation. Each inverter drives each base to a known potential, such as to ground or power supply potential, that will prevent unintended programming. For example, the base of column select programming transistors 176-182 can be allowed to reach steady state operation, i.e., fully charge the base parasitic capacitance of transistors 176-182 by way of inverters 190 and 192 and PN junctions, for the particular programming sequence before enabling row select programming transistor 170 or 174. Each column select programming transistor 176-182 not intended to be turned on in the programming sequence should be controlled to ensure each remains non-conductive, particularly in the presence of parasitic effects. The proper programming sequence to control timing of control signals $C_0$ and $C_1$ to pre-charge the base parasitic capacitance of transistors 176-182 with inverters 190 and 192 prior to the fuse programming, together with the use of PN junctions, avoids unintended programming of vertical OTP fuses 132a-132l.

Following the programming sequence, read block 196 is used to read the values of vertical OTP fuses 132a-132l. Programming current source 164 is disabled and read current source 198 is enabled. Current source 198 provides a read current, substantially less than the programing current. The read current is sufficient to measure resistance of vertical OTP fuse 132, but insufficient to program any OTP fuse, independent of how many times the fuse resistance is measured.

To read vertical OTP fuse 132a, a high value of control signal $R_0$ is applied to the gate of transistor 170, and a low value of control signal $R_1$ is applied to the gate of transistor 174. A high value of control signal $C_0$ is applied to the input of inverter 190 (often final step to avoid parasitic issues), and a low value of control signal $C_1$ is applied to the input of inverter 192. Transistor 170 conducts and transistors 174 and 180 are non-conductive. The low voltage from inverter 190 forward biases and turns on transistor 176. The high voltage from inverter 192 turns off transistors 178 and 182. The low value read current from current source 198, e.g., up to 1 mA depending on the technology feature size, physical dimensions, and material properties, flows through transistor 170, vertical OTP fuse 132a, and transistor 176 and develops a read voltage on row line 168. A high control signal $R_3$ turns on transistor 200 to pass the read voltage to a first input of comparator 202. A low control signal $R_4$ turns off transistor 204 to isolate row line 172.

Current source 210 receives operating potential from power supply terminal 212 and injects a threshold current into node 214 at a second input of comparator 202. Resistor 216 is coupled between node 214 and an emitter of transistor 218, and the collector of transistor 218 is coupled to power supply terminal 220 operating at ground potential. A high control signal $R_5$ is coupled to an input of inverter 222 to generate a low voltage at the base of transistor 218. Transistor 218 turns on and conducts the threshold current through resistor 216 and transistor 218 to develop a threshold voltage at the second input of comparator 202. The threshold current is about the same as the read current from current source 198. In particular, a value of current source 210 and resistor 216 is selected to develop a threshold voltage at the second input of comparator 202 between a minimum resistance of an unprogrammed vertical OTP fuse 132 and a maximum resistance of a programmed vertical OTP fuse.

If vertical OTP fuse 132a is programmed and exhibits a high resistance, the read voltage on row line 168 in response to the read current through OTP fuse 132a will exceed the threshold voltage on the second input of comparator 202. The output of comparator 202 will go to a high voltage value indicating vertical OTP fuse 132a is programmed logic one. If vertical OTP fuse 132a is unprogrammed and exhibits a low resistance, the read voltage on row line 168 in response to the read current through OTP fuse 132a will be less than the threshold voltage on the second input of comparator 202. The output of comparator 202 will go to a low voltage value indicating vertical OTP fuse 132a is unprogrammed logic zero.

To read vertical OTP fuse 132b, a high value of control signal $R_0$ is applied to the gate of transistor 170, and a low value of control signal $R_1$ is applied to the gate of transistor 174. A low value of control signal $C_0$ is applied to the input of inverter 190, and a high value of control signal $C_1$ is applied to the input of inverter 192. Transistor 170 conducts and transistors 174 and 182 are non-conductive. The low voltage from inverter 192 forward biases and turns on transistor 178. The high voltage from inverter 190 turns off transistors 176 and 180. The low read current from current source 198 flows through transistor 170, vertical OTP fuse 132b, and transistor 178 and develops a read voltage on row line 168. A high control signal $R_3$ turns on transistor 200 to pass the read voltage to the first input of comparator 202. A low control signal $R_4$ turns off transistor 204 to isolate row line 172.

If vertical OTP fuse 132b is programmed and exhibits a high resistance, the read voltage on row line 168 in response to the read current through OTP fuse 132b will exceed the threshold voltage on the second input of comparator 202. The output of comparator 202 will go to a high voltage value indicating vertical OTP fuse 132b is programmed logic one. If vertical OTP fuse 132a is unprogrammed and exhibits a low resistance, the read voltage on row line 168 in response to the read current through OTP fuse 132b will be less than the threshold voltage on the second input of comparator 202. The output of comparator 202 will go to a low voltage value indicating vertical OTP fuse 132b is unprogrammed logic zero.

To read vertical OTP fuse 132e, a low value of control signal $R_0$ is applied to the gate of transistor 170, and a high value of control signal $R_1$ is applied to the gate of transistor 174. A high value of control signal $C_0$ is applied to the input of inverter 190, and a low value of control signal $C_1$ is applied to the input of inverter 192. Transistor 174 conducts and transistors 170 and 176 are non-conductive. The low voltage from inverter 190 forward biases and turns on transistor 180. The high voltage from inverter 192 turns off transistors 178 and 182. The low read current from current source 198 flows through transistor 174, vertical OTP fuse 132e, and transistor 180 and develops a read voltage on row line 172. A high control signal $R_4$ turns on transistor 204 to pass the read voltage to the first input of comparator 202. A low control signal $R_3$ turns off transistor 200 to isolate row line 168.

If vertical OTP fuse 132e is programmed and exhibits a high resistance, the read voltage on row line 172 in response to the read current through OTP fuse 132e will exceed the threshold voltage on the second input of comparator 202. The output of comparator 202 will go to a high voltage value indicating vertical OTP fuse 132e is programmed logic one. If vertical OTP fuse 132e is unprogrammed and exhibits a low resistance, the read voltage on row line 172 in response to the read current through OTP fuse 132e will be less than the threshold voltage on the second input of comparator 202. The output of comparator 202 will go to a low voltage value indicating vertical OTP fuse 132e is unprogrammed logic zero.

To read vertical OTP fuse 132f, a low value of control signal $R_0$ is applied to the gate of transistor 170, and a high value of control signal $R_1$ is applied to the gate of transistor 174. A low value of control signal $C_0$ is applied to the input of inverter 190, and a high value of control signal $C_1$ is applied to the input of inverter 192. Transistor 174 conducts and transistors 170 and 178 are non-conductive. The low voltage from inverter 192 forward biases and turns on transistor 182. The high voltage from inverter 190 turns off transistors 176 and 180. The low read current from current source 198 flows through transistor 174, vertical OTP fuse 132f, and transistor 182 and develops a read voltage on row line 172. A high control signal $R_4$ turns on transistor 204 to pass the read voltage to the first input of comparator 202. A low control signal $R_3$ turns off transistor 200 to isolate row line 168.

If vertical OTP fuse 132f is programmed and exhibits a high resistance, the read voltage on row line 172 in response to the read current through OTP fuse 132f will exceed the threshold voltage on the second input of comparator 202. The output of comparator 202 will go to a high voltage value indicating vertical OTP fuse 132f is programmed logic one.

If vertical OTP fuse 132f is unprogrammed and exhibits a low resistance, the read voltage on row line 172 in response to the read current through OTP fuse 132f will be less than the threshold voltage on the second input of comparator 202. The output of comparator 202 will go to a low voltage value indicating vertical OTP fuse 132f is unprogrammed logic zero.

Figure 8:
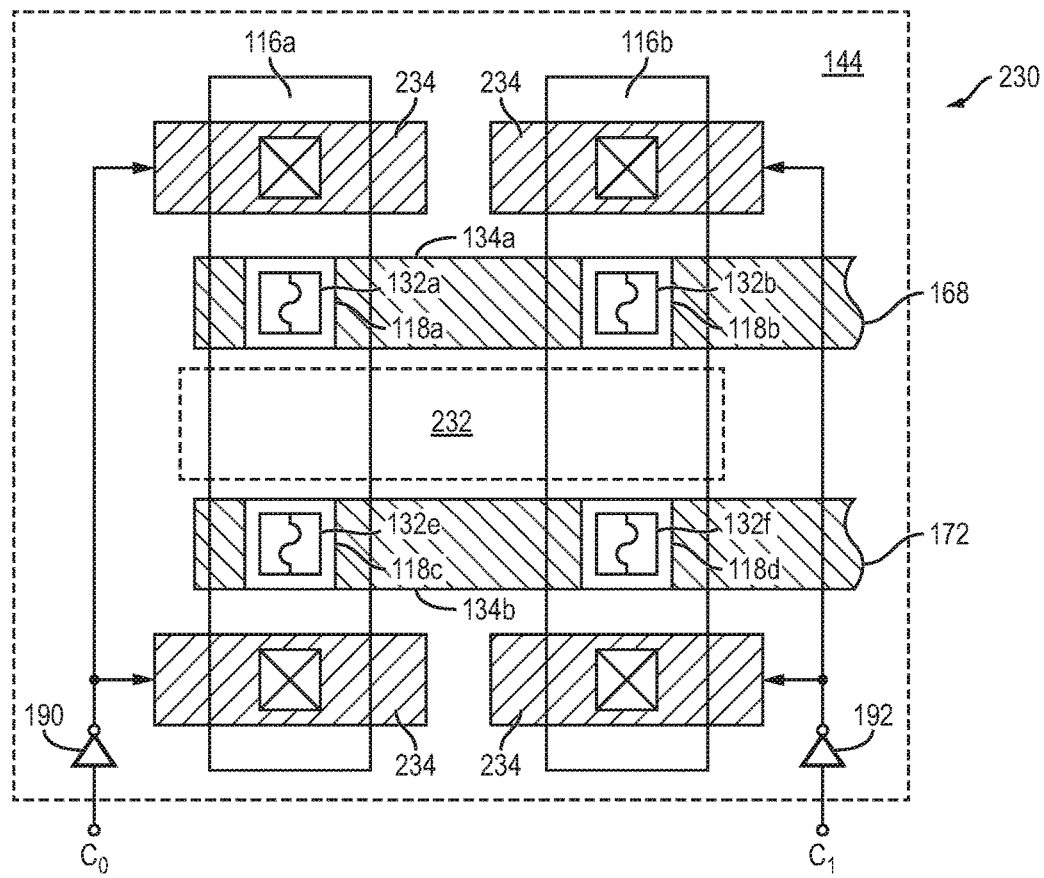

FIG. 8 illustrates a plan view of layout 230 to implement a portion of array 160 of FIG. 6a. Base substrate 144 is a P-type region and includes N-type regions 116a-116b as vertical stripes for the bases of transistors 176-182. Each column of transistors 176-182 has base regions coupled together by virtue of region 116 being a stripe extending between the transistors. In some embodiments, an optional P-stripe 232 is used to isolate transistors 176-182 within a column. P-type regions 118 are formed in region 116 as the emitter of transistors 176-182 for each vertical OTP fuse 132. Vertical OTP fuses 132a-132l are formed on each region 118, see FIG. 3. Conductive layer 134a-134b routes the connections at the tops of vertical OTP fuses 132 to transistors 170 and 174. Conductive layer 234 connects region 116 of each column of OTP fuses 132 to an associated inverter and column control signal. Conductive layer 234 is formed as part of the same metal layer or a different metal layer than conductive layer 134.

Figure 9:
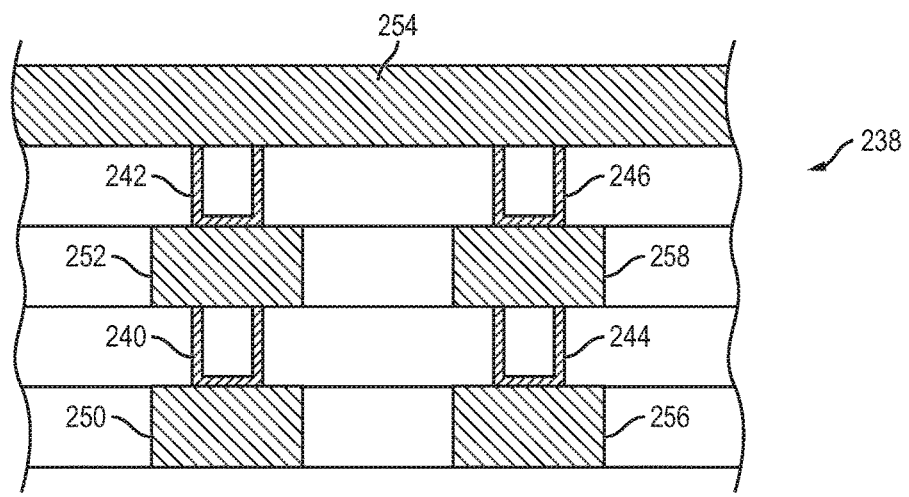
FIG. 9 illustrates stacked vertical OTP fuses for redundancy.

FIG. 9 illustrates a redundancy arrangement 238 with stacked vertical OTP fuses 240 and 242 along with fuses 244 and 246 for high reliability applications, such as automotive. Each vertical OTP fuses 240-246 is formed similar to FIGS. 2a-2d. Vertical OTP fuse 240 is formed between conductive layer 250 and conductive layer 252. Vertical OTP fuse 242 is formed between conductive layer 252 and conductive layer 254. Accordingly, vertical OTP fuses 240 and 242 are physically connected as redundant fuses in a vertically aligned and stacked configuration. Vertical OTP fuse 244 is formed between conductive layer 256 and conductive layer 258. Vertical OTP fuse 246 is formed between conductive layer 258 and conductive layer 254. Accordingly, vertical OTP fuses 244 and 246 are physically connected as redundant fuses in a vertically aligned and stacked configuration.

Figure 10:
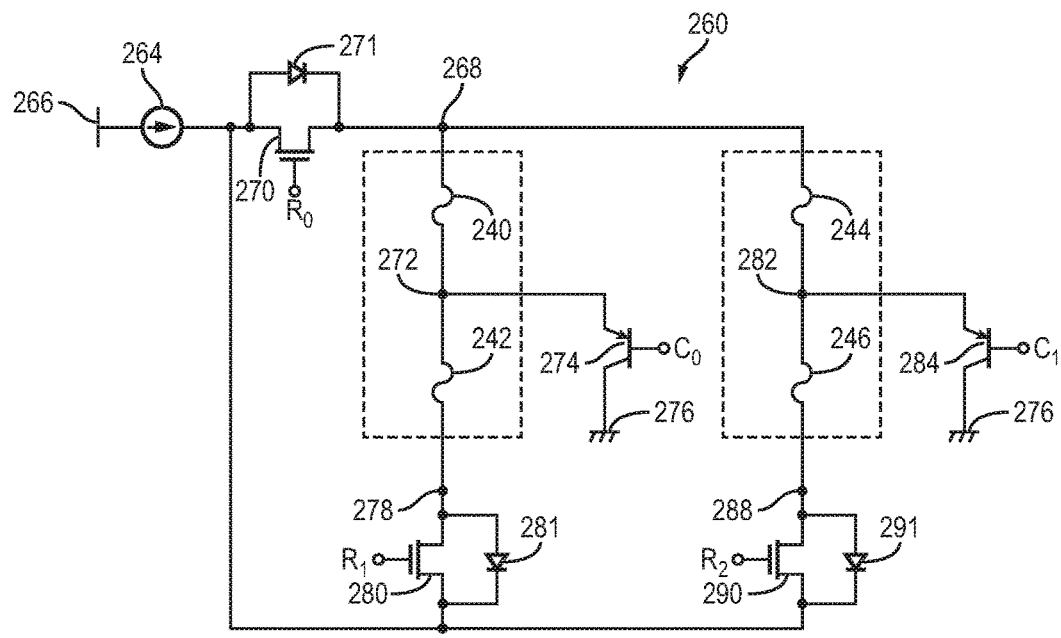
FIG. 10 illustrates a circuit for programming the redundant vertical OTP fuses in FIG. 9.

FIG. 10 illustrates programming circuit 260 for vertical OTP fuses 240-246. Current source 264 receives operating potential from voltage source 266 and drives node 268 through transistor 270. Control signal $R_0$ is coupled to the gate of transistor 270. Vertical OTP fuse 240 is coupled between node 268 and node 272. The emitter of transistor 274 is coupled to node 272, and the collector of transistor 274 is coupled to power supply terminal 276 operating at ground potential. The base of transistor 274 receives control signal $C_0$. Current source 264 also drives node 278 through transistor 280. Control signal $R_1$ is coupled to the gate of transistor 280. Vertical OTP fuse 242 is coupled between node 278 and node 272. Vertical OTP fuse 244 is coupled between node 268 and node 282. The emitter of transistor 284 is coupled to node 282, and the collector of transistor 284 is coupled to power supply terminal 276. The base of transistor 284 receives control signal $C_1$. Current source 264 drives node 288 through transistor 290. Control signal $R_2$ is coupled to the gate of transistor 290. Diodes 271, 281, and 291 show the orientation of transistors 270, 280, and 290, respectively. Vertical OTP fuse 246 is coupled between node 288 and node 282. Transistors 274 and 284 are implemented by regions 116, region 118, and substrate 144, as described in FIG. 3.

To program vertical OTP fuse 240, a high value of control signal $R_0$ is applied to the gate of transistor 270, and a low value of control signals $R_1$ and $R_2$ is applied to the gate of transistors 280 and 290. A low value of control signal $C_0$ is applied to the base of transistor 274 (often final step to avoid parasitic issues), and a high value of control signal $C_1$ is applied to the base of transistor 284. Transistor 270 conducts and transistors 280 and 290 are non-conductive. The low control signal $C_0$ forward biases and turns on transistor 274. The high control signal $C_1$ turns off transistor 284. The high programming current from current source 264 flows through transistor 270, vertical OTP fuse 240, and transistor 274. The high programming current is sufficient to program the fuse, as described in FIG. 2f. Vertical OTP fuse 240 is permanently set to a programmed logic state, e.g., logic one.

To program vertical OTP fuse 242, a high value of control signal $R_1$ is applied to the gate of transistor 280, and a low value of control signals $R_0$ and $R_2$ is applied to the gate of transistors 270 and 290. A low value of control signal $C_0$ is applied to the base of transistor 274, and a high value of control signal $C_1$ is applied to the base of transistor 284. Transistor 280 conducts and transistors 270 and 290 are non-conductive. The low control signal $C_0$ forward biases and turns on transistor 274. The high control signal $C_1$ turns off transistor 284. The high programming current from current source 264 flows through transistor 280, vertical OTP fuse 242, and transistor 274. The high programming current is sufficient to program the fuse, as described in FIG. 2f. Vertical OTP fuse 242 is permanently set to a programmed logic state, e.g., logic one.

To program vertical OTP fuse 244, a high value of control signal $R_0$ is applied to the gate of transistor 270, and a low value of control signals $R_1$ and $R_2$ is applied to the gate of transistors 280 and 290. A high value of control signal $C_0$ is applied to the base of transistor 274, and a low value of control signal $C_1$ is applied to the base of transistor 284. Transistor 270 conducts and transistors 280 and 290 are non-conductive. The low control signal $C_1$ forward biases and turns on transistor 284. The high control signal $C_0$ turns off transistor 274. The high programming current from current source 264 flows through transistor 270, vertical OTP fuse 244, and transistor 284. The high programming current is sufficient to program the fuse, as described in FIG. 2f. Vertical OTP fuse 244 is permanently set to a programmed logic state, e.g., logic one.

To program vertical OTP fuse 246, a high value of control signal $R_2$ is applied to the gate of transistor 290, and a low value of control signals $R_0$ and $R_1$ is applied to the gate of transistors 270 and 280. A high value of control signal $C_0$ is applied to the base of transistor 274, and a low value of control signal $C_1$ is applied to the base of transistor 284. Transistor 290 conducts and transistors 270 and 280 are non-conductive. The low control signal $C_1$ forward biases and turns on transistor 284. The high control signal $C_0$ turns off transistor 274. The high programming current from current source 264 flows through transistor 290, vertical OTP fuse 246, and transistor 284. The high programming current is sufficient to program the fuse, as described in FIG. 2f. Vertical OTP fuse 246 is permanently set to a programmed logic state, e.g., logic one.

The read operation is similar to that described for FIG. 7. Vertical OTP fuses 240-242 are read individually and logically combined into a single memory bit. Likewise, vertical OTP fuses 244-246 are read individually and logically combined into a single memory bit. Vertical OTP fuse 240 is redundant with vertical OTP fuse 242, and vertical OTP fuse 244 is redundant with vertical OTP fuse 246. That is, either vertical OTP fuse 240 or 242 can provide a first configuration value, and either vertical OTP fuse 244 or 246 can provide a second configuration value. Stacking vertical OTP fuses 240 and 242, and stacking vertical OTP fuses 244 and 246, provides the total redundancy of each configuration mode without utilizing additional silicon area. Given the reality of less than 100% manufacturing yield and the possibility of failure of any OTP fuse, the redundant configuration and operation improves reliability by increasing likelihood that at least one fuse for each configuration mode is available and operational for programming. The redundant fuse combinations allow for higher programming yield and reliability while consuming no additional die area.

Figure 11:
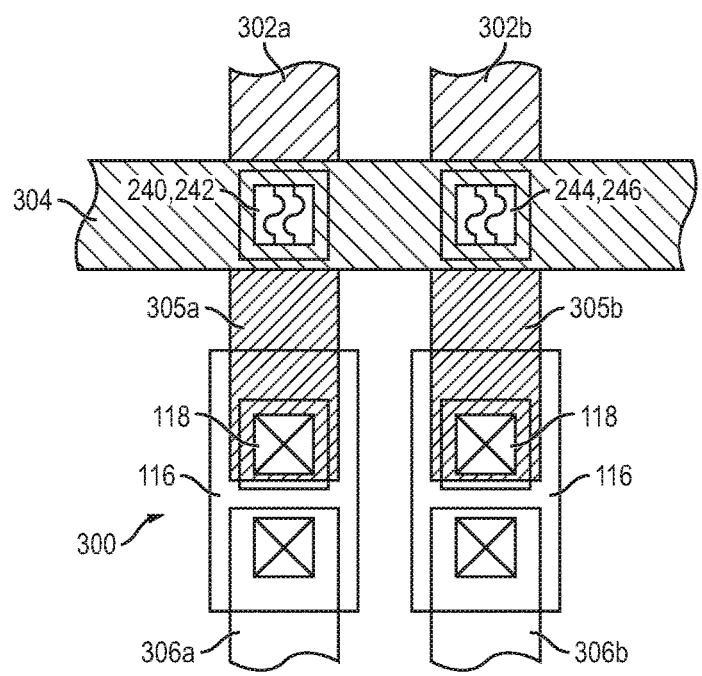
FIG. 11 illustrates a layout for the redundant vertical OTP fuses in FIG. 9.

FIG. 11 illustrates a plan view of layout 300 to implement redundancy arrangement 238 of FIG. 9. Conductive layer 302a-302b connect to the bottom of vertical OTP fuses 242 and 246. Conductive layers 302a and 305a, or 302b and 305b, route current to OTP fuse 242 when transistors 280 and 274 are turned on, or routes current to OTP fuse 246 when transistors 290 and 284 are turned on, respectively. Conductive layer 304 extends laterally over vertical OTP fuses 240 and 244 to connect the fuses transistor 270. When transistor 270 is turned on, conductive layer 304 routes current to OTP fuse 240 when transistor 274 is turned on, and routes current to OTP fuse 244 when transistor 284 is turned on. Conductive layer 306a-306b make connection to the base of transistors 274 and 284.

Figure 12A:
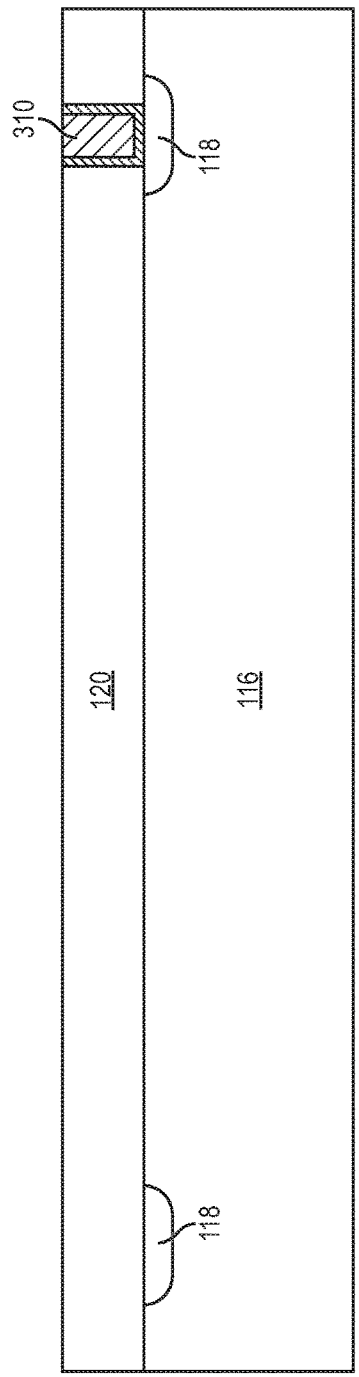
FIGS. 12a-12e illustrate further detail of forming a vertical OTP fuse over a PN junction and conductive layers over insulating layers.
Figure 12B:
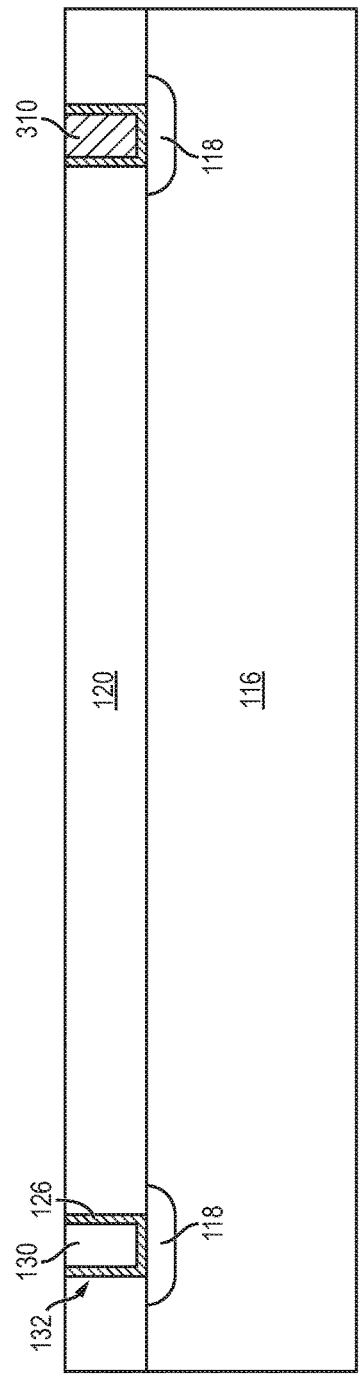
Figure 12C:
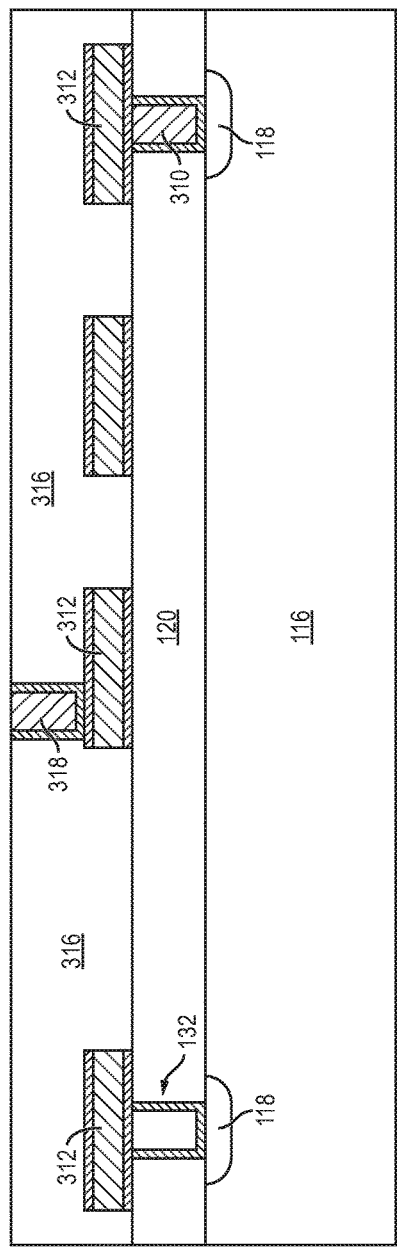

FIGS. 12a-12e illustrate further detail of forming vertical OTP fuse 132. In FIG. 12a, insulating layer 120 is formed over base substrate material 102. A conductive plug 310 is formed through insulating layer 120 aligned with and extending to region 118. In FIG. 12b, vertical OTP fuse 132, with resistive core material 130 and conductive layer 126 around the resistive core material, is formed through insulating layer 120 aligned with and extending to region 118, as described in FIGS. 2a-2d. In FIG. 12c, conductive layer 312 is formed over insulating layer 120 and contacts vertical OTP fuse 132 and conductive plug 310. An insulating layer 316 is formed over insulating layer 120 and conductive layer 312. A conductive plug 318 is formed through insulating layer 316 extending to conductive layer 312.

Figure 12D:
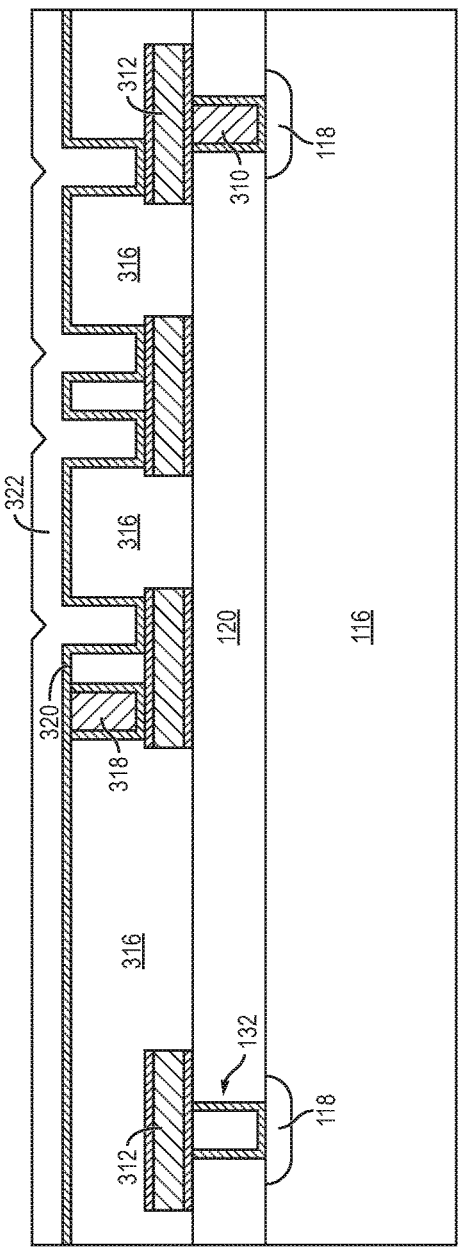
Figure 12E:
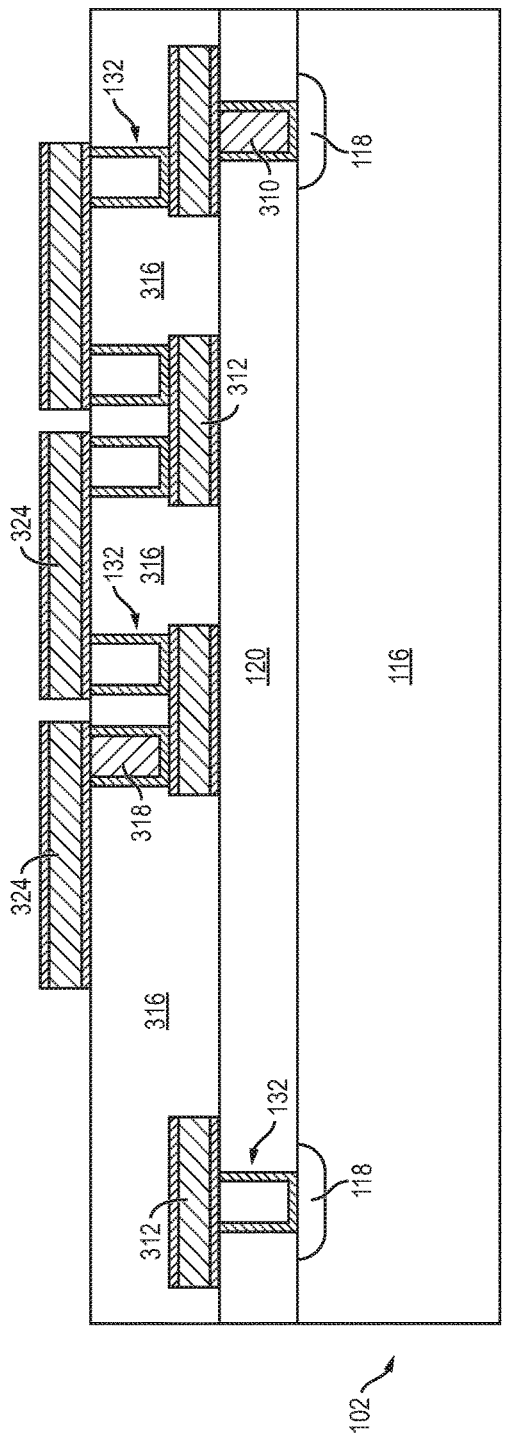

In FIG. 12d, an opening is formed through insulating layer 316 over conductive layer 312. Conductive layer 320 is conformally applied over insulating layer 316 and into the opening. Resistive material 322 is deposited over conductive layer 320, including into the opening through the insulating layer 316. In FIG. 12e, excess conductive layer 320 and resistive material 322 is removed, leaving vertical OTP fuses 132. Conductive layer 324 is formed over insulating layer 316 and contacts vertical OTP fuse 132 and conductive plug 318.

Figure 13:
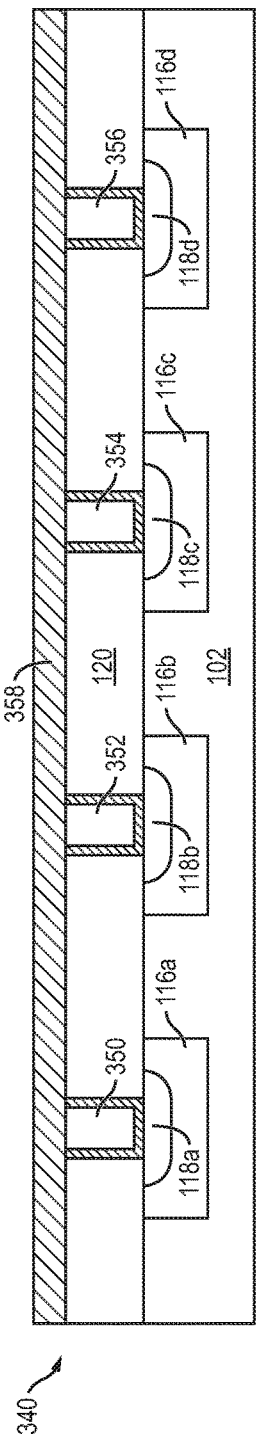
FIG. 13 illustrates vertical OTP fuses arranged laterally for redundancy.

FIG. 13 illustrates an alternate redundancy arrangement 340 with vertical OTP fuses 350, 352, 354, and 356 extending through insulating layer 120 and arranged laterally over regions 118a-118d, respectively, of base substrate material 102. Vertical OTP fuses 350-356 are formed similar to FIGS. 2a-2d with the OTP fuses disposed over and vertically aligned with the transistors formed by regions 118a-118d, regions 116a-116d, and base substrate 102 to individually control conduction through vertical OTP fuses 350-356, respectively. Conductive layer 358 is formed over insulating layer 120 and vertical OTP fuses 350-356. Vertical OTP fuses 350 and 352 represent a first laterally arranged redundant fuse set, and vertical OTP fuses 354 and 356 represent a second laterally arranged redundant fuse set.

Figure 14:
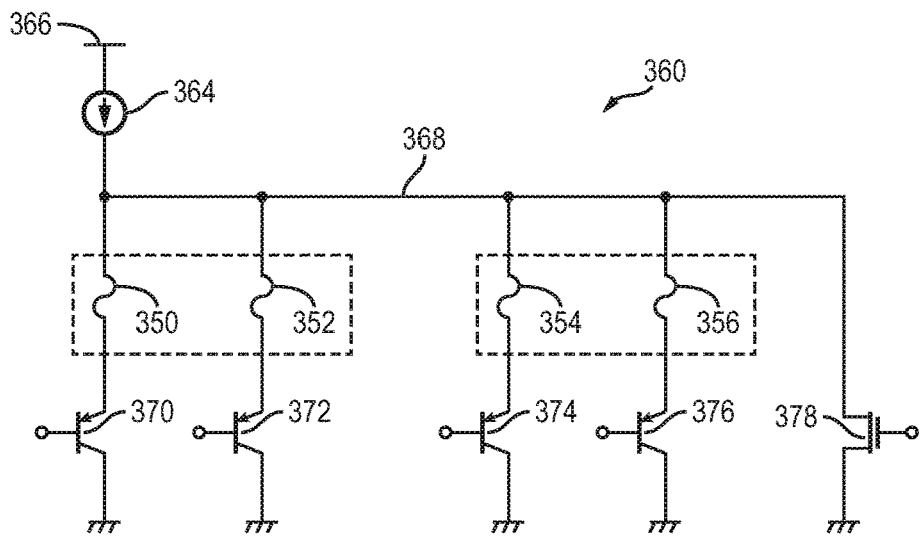
FIG. 14 illustrates a circuit for programming the redundant vertical OTP fuses in FIG. 13.

FIG. 14 illustrates programming circuit 360 for vertical OTP fuses 350-356. Current source 364 receives operating potential from voltage source 366 and drives node 368. Vertical OTP fuse 350 is coupled between node 368 and transistor 370. Vertical OTP fuse 352 is coupled between node 368 and transistor 372. Vertical OTP fuse 354 is coupled between node 368 and transistor 374. Vertical OTP fuse 356 is coupled between node 368 and transistor 376. Transistors 370-376 are formed similar to FIG. 3, i.e., with regions 118a-118d, regions 116a-116d, and base substrate 102 vertically aligned with OTP fuses 350-356. The vertical alignment of transistors 370-376 with OTP fuses 350-356 saves die area while providing individually control of the conduction path through each OTP fuse. The base of transistors 370-376 receive a control signal from an inverter, similar to FIG. 7.

Transistor 378 provides a path to shunt the programming current from node 368. To program vertical OTP fuse 350, transistor 378 is first enabled to initially shunt away the programming current. Transistor 370 is turned on to reach steady state while the programming current is routed through transistor 378 and then transistor 378 is disabled to re-route the programming current through vertical OTP fuse 350 and transistor 370. In a similar manner, vertical OTP fuse 352 is programmed by turning on transistor 372, vertical OTP fuse 354 is programmed by turning on transistor 374, and vertical OTP fuse 356 is programmed by turning on transistor 376.

Figure 15:
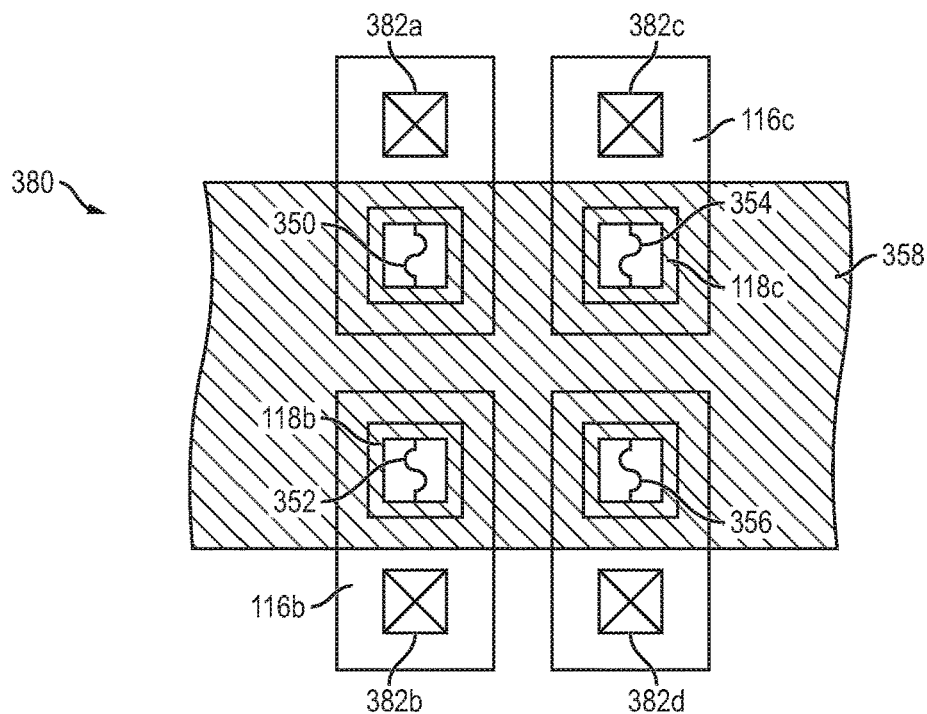
FIG. 15 illustrates a layout for the redundant vertical OTP fuses in FIG. 13.

FIG. 15 illustrates a plan view of layout 380 to implement redundancy arrangement 340 of FIG. 13. Conductive layer 358 connects to the top of vertical OTP fuses 350-356. Contacts 382a-382d are routed to the base of transistors 370-376, respectively.

Figure 16:
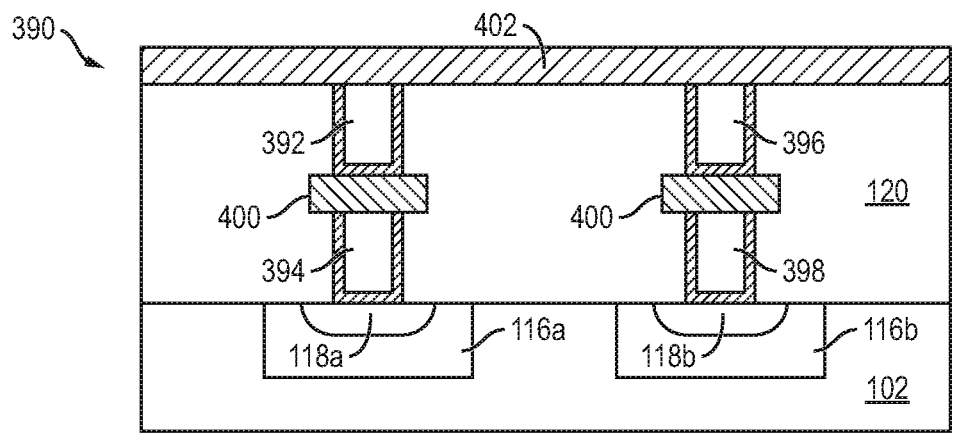
FIG. 16 illustrates stacked vertical OTP fuses for redundancy.

FIG. 16 illustrates another redundancy arrangement 390 with vertical OTP fuses 392, 394, 396, and 398 extending through insulating layer 120 and stacked over regions 118a-118b, respectively, of base substrate material 102. Vertical OTP fuses 392-398 are formed similar to FIGS. 2a-2d with the OTP fuses disposed over and vertically aligned with the transistors formed by regions 118a-118b, regions 116a-116b, and base substrate 102 to individually control conduction through vertical OTP fuses 392-398, respectively. Conductive layer 400 is formed between vertical OTP fuses 392 and 394 and between vertical OTP fuses 396 and 398. Conductive layer 402 is formed over insulating layer 120 and vertical OTP fuses 392-398. Vertical OTP fuses 392 and 394 represent a first vertically arranged redundant fuse set, and vertical OTP fuses 396 and 398 represent a second vertically arranged redundant fuse set.

Figure 17:
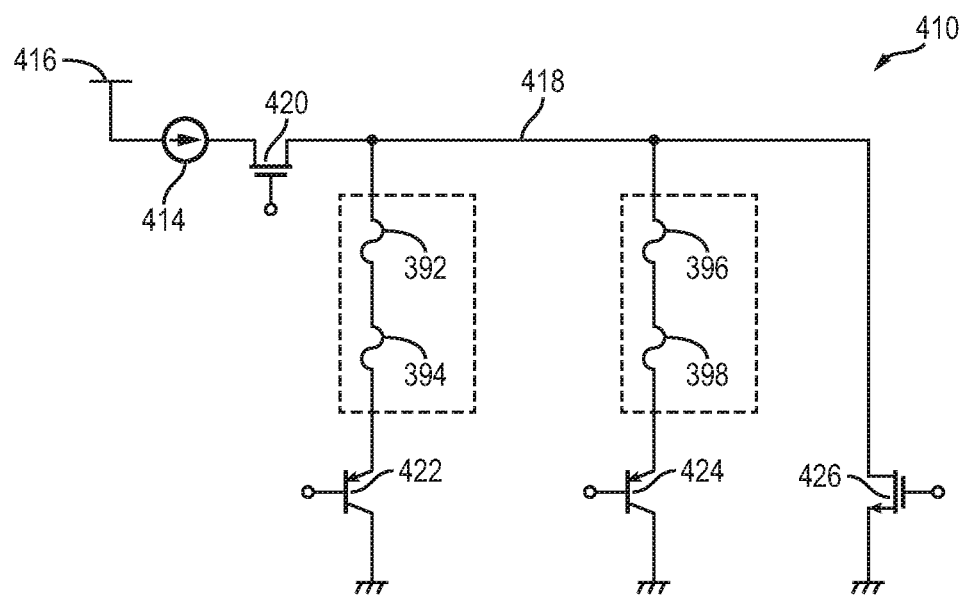
FIG. 17 illustrates a circuit for programming the redundant vertical OTP fuses in FIG. 16.

FIG. 17 illustrates programming circuit 410 for vertical OTP fuses 392-398. Current source 414 receives operating potential from voltage source 416 and drives node 418 through transistor 420. Vertical OTP fuses 392 and 394 are serially coupled between node 418 and transistor 422. Vertical OTP fuses 396 and 398 are serially coupled between node 418 and transistor 424. Transistors 422-424 are formed similar to FIG. 3, i.e., with regions 118a-118b, regions 116a-116b, and base substrate 102 vertically aligned with OTP fuses 392-398. The vertical alignment of transistors 422-424 with OTP fuses 392-398 saves die area while providing individually control of the conduction path through each pair of redundant OTP fuses. The base of transistors 422 and 424 receive a control signal from an inverter, similar to FIG. 7. Vertical OTP fuses 392 and 394 are simultaneously programmed by turning on transistor 422. Vertical OTP fuses 394 and 398 are simultaneously programmed by turning on transistor 424.

Transistor 426 provides a path to shunt the programming current from node 418. To program vertical OTP fuses 392 and 394, transistor 426 is first enabled to initially shunt away the programming current. Transistor 422 is turned on to reach steady state while the programming current is routed through transistor 426 and then transistor 426 is disabled to re-route the programming current through vertical OTP fuses 392 and 394 and transistor 422. To program vertical OTP fuses 396 and 398, transistor 426 is first enabled to initially shunt away the programming current. Transistor 424 is turned on to reach steady state while the programming current is routed through transistor 426 and then transistor 426 is disabled to re-route the programming current through vertical OTP fuses 396 and 398 and transistor 424.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
    providing a substrate;
    forming a first insulating layer over the substrate;
    forming a first opening through the first insulating layer;
    forming a first conductive layer along a sidewall of the first opening; and
    depositing a resistive material within the first opening over the first conductive layer, wherein:
        the resistive material has a resistivity 10 times or greater than the first conductive layer, and
        the first conductive layer and resistive material form a vertical one-time-programmable (OTP) fuse with electrically conductive properties associated with the fuse along the sidewall of the first opening.

2. The method of claim 1, wherein the first conductive layer includes silicide material.

3. The method of claim 1, wherein the resistive material includes polysilicon.

4. The method of claim 1, further including forming a second conductive layer over the vertical OTP fuse.

5. The method of claim 4, further including:
    forming a second insulating layer over the substrate prior to forming the first insulating layer;
    forming a second opening through the second insulating layer;
    depositing a conductive material in the second opening; and
    forming a third conductive layer over the second insulating layer and conductive material, wherein the vertical OTP fuse is disposed between the second conductive layer and third conductive layer.

6. A method of making a vertical one-time-programmable (OTP) fuse, comprising:
    forming a first doped region within a well region, wherein the first doped region and the well region have opposite conductivity types;
    forming a first insulating layer over the first doped region with a first opening through the first insulating;
    forming a conductive layer along a sidewall of the first opening, wherein the conductive layer is coupled to the first doped region; and
    depositing a resistive material within the first opening over the conductive layer to form a first vertical OTP fuse.

7. The method of claim 6, wherein the conductive layer directly contacts the first doped region.

8. The method of claim 6, wherein forming the first doped region within the well region is performed to form a diode including the first doped and well regions.

9. The method of claim 6, wherein forming the first doped region within the well region is performed to form parts of a first transistor.

10. The method of claim 6, wherein the first transistor is a PNP bipolar junction transistor.

11. The method of claim 10, further comprising forming an isolation region extending through the well region, wherein :
forming the doped region within the well region includes forming a second doped region within the well region, wherein the second doped region has an opposite conductivity type as compared to the well region,
the first transistor includes the first doped region and a first portion of the well region, and a second transistor includes the second doped region and a second portion of the well region,
forming the first insulating layer includes forming the first insulating layer over the second doped region with a second opening through the first insulating layer,
forming the conductive layer includes forming the conductive layer along a sidewall of the second opening, wherein the conductive layer within the second opening is coupled to the second doped region,
depositing the resistive material includes depositing the resistive material within the second opening over the conductive layer to form a second vertical OTP fuse within the second opening of the first insulating layer, and
from a top view, the first transistor and the first vertical OTP are along one side of the isolation region, and the second transistor and the second vertical OTP fuse are along an opposite side of the isolation region.

12. The method of claim 6, further including forming a second vertical OTP fuse at a different elevation as compared to the first vertical OTP fuse, wherein the second vertical OTP fuse is for redundancy.

13. A semiconductor device, comprising:
a substrate;
a first insulating layer over the substrate with a first opening through the first insulating layer; and
a first vertical one-time programmable (OTP) fuse within the first opening and including:
a first conductive layer along a sidewall of the first opening; and
a resistive material within the first opening over the first conductive layer, wherein the resistive material has a resistivity 10 times or greater than the first conductive layer.

14. The semiconductor device of claim 13, wherein the first conductive layer includes silicide material.

15. The semiconductor device of claim 13, further including:
a second conductive layer under the first vertical OTP fuse:
a second insulating layer over the substrate with a second opening through the second insulating layer;
a conductive material in the second opening; and
a third conductive layer over the second insulating layer and conductive material, wherein the first vertical OTP fuse is disposed between the second conductive layer and third conductive layer.

16. The semiconductor device of claim 13, further including a second vertical OTP fuse lying at a different elevation as compared to the first vertical OTP fuse, wherein the second vertical OTP is for redundancy.

17. The semiconductor device of claim 13, further including a plurality of vertical OTP fuses arranged in an array across the substrate.

18. The semiconductor device of claim 14, further comprising:
a second conductive layer overlying the first vertical OTP fuse;
a second insulating layer over the substrate with a second opening through the second insulating layer;
a second vertical OTP fuse within the second opening: and an electronic component including a first terminal and a second terminal,
wherein the first OTP fuse, the second OTP fuse, and the first terminal of the electronic component are coupled to one another at a node, and the second terminal of the electronic component is coupled to another part of the electronic device.

19. A semiconductor device, comprising:
a substrate;
a first insulating layer formed over the substrate with a first opening through the first insulating layer, wherein the first opening has a bottom; and
a programmed vertical one-time-programmable (OTP) fuse within the first opening and including:
a first conductive layer spaced apart from the bottom of the first opening; and
a resistive fill material remaining within the first opening.

20. The semiconductor device of claim 19, wherein the resistive fill material lies at a center of the programmed vertical OTP fuse.

* * * * *